(12) United States Patent
Lv et al.

(10) Patent No.: US 12,067,459 B2
(45) Date of Patent: Aug. 20, 2024

(54) QUANTUM CIRCUIT GENERATION METHOD AND RELATED DEVICE

(71) Applicant: Huawei Technologies Co., Ltd., Shenzhen (CN)

(72) Inventors: Dingshun Lv, Shenzhen (CN); Changsu Cao, Shenzhen (CN); Xusheng Xu, Shenzhen (CN); Manhong Yung, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 157 days.

(21) Appl. No.: 17/744,984

(22) Filed: May 16, 2022

(65) Prior Publication Data
US 2022/0269967 A1    Aug. 25, 2022

Related U.S. Application Data

(63) Continuation of application No. PCT/CN2020/129127, filed on Nov. 16, 2020.

(30) Foreign Application Priority Data

Nov. 15, 2019    (CN) .......................... 201911119363.6

(51) Int. Cl.
*G06N 10/20*    (2022.01)
*G02F 3/00*    (2006.01)
(Continued)

(52) U.S. Cl.
CPC ............... *G06N 10/20* (2022.01); *G02F 3/00* (2013.01); *G06F 1/00* (2013.01); *G06N 10/00* (2019.01); *G06N 10/60* (2022.01); *H03K 19/02* (2013.01)

(58) Field of Classification Search
CPC ........ G06N 10/20; G06N 10/60; G06N 10/00; H03K 19/02; G02F 3/00; G06F 1/00
(Continued)

(56) References Cited

U.S. PATENT DOCUMENTS

| 10,102,479 B2 | 10/2018 | Tucci |
| 2008/0192315 A1 | 8/2008 | Goto et al. |
| 2022/0164501 A1* | 5/2022 | Nosanow ............... G06N 10/60 |

FOREIGN PATENT DOCUMENTS

| CN | 101246378 A | 8/2008 |
| CN | 106529681 A | 3/2017 |

(Continued)

OTHER PUBLICATIONS

Xao et al(NPL : Quantum Chemistry in the age of Quantum Computing, American Chemical Soc., Chem Rev Aug. 30, 2019) (Year: 2019).*
(Continued)

*Primary Examiner* — Arnold M Kinkead
(74) *Attorney, Agent, or Firm* — Conley Rose, P.C.

(57) ABSTRACT

A quantum circuit generation method includes determining a reference state of a target molecule and N excitations states corresponding to the reference state, where N is a positive integer greater than or equal to 1; determining M excitations states from the N excitations states based on an attribute of the reference state and attributes of the N excitations states, where M is a positive integer greater than or equal to 1 and less than or equal to N; and generating a first quantum circuit based on the M excitations states such as to improve computation efficiency and to reduce resource consumption.

20 Claims, 6 Drawing Sheets

(51) Int. Cl.
  *G06F 1/00* (2006.01)
  *G06N 10/00* (2022.01)
  *G06N 10/60* (2022.01)
  *H03K 19/02* (2006.01)

(58) Field of Classification Search
  USPC ......... 435/287.2, 6; 372/1; 436/518; 702/19, 702/27; 326/1
  See application file for complete search history.

(56) References Cited

FOREIGN PATENT DOCUMENTS

| CN | 109438519 A | 3/2019 |
| CN | 110188885 A | 8/2019 |
| CN | 110322935 A | 10/2019 |
| WO | 2014053408 A1 | 4/2014 |

OTHER PUBLICATIONS

Ryan Babbush et al, "Low-Depth Quantum Simulation of Materials," Published by the American Physical Society, Mar. 21, 2018, 40 pages.

Madyslav Verteletskyi et al, "Measurement Optimization in the Variational Quantum Eigensolver Using a Minimum Clique Cover," Oct. 5, 2019, 6 pages.

Tzu-Ching Yen et al, "Measuring all compatible operators in one series of single-qubit measurements using unitary transformations," Aug. 17, 2019, 11 pages.

John Preskill, "Quantum Computing in the NISQ era and beyond," Jul. 31, 2018, 20 pages.

Ilya G. Ryabinkin et al, "Qubit coupled-cluster method: A systematic approach to quantum chemistry on a quantum computer," Sep. 11, 2018, 11 pages.

Artur F. Izmaylov et al, "Revising measurement process in the variational quantum eigensolver: Is it possible to reduce the number of separately measured operators?," Feb. 21, 2019, 10 pages.

Gian Salis et al, "Short-depth trial-wavefunctions for the variational quantum eigensolver based on the problem Hamiltonian," Aug. 26, 2019, 6 pages.

Artur F. Izmaylov et al, "Unitary partitioning approach to the measurement problem in the Variational Quantum Eigensolver method," Oct. 18, 2019, 7 pages.

Paolo Giorda et al, "Universal quantum control in irreducible state-space sectors: application to bosonic and spin-boson systems," Aug. 25, 2003, 10 pages.

* cited by examiner

|  | $A_g$ | $B_{1g}$ | $B_{2g}$ | $B_{3g}$ | $A_u$ | $B_{1u}$ | $B_{2u}$ | $B_{3u}$ |
|---|---|---|---|---|---|---|---|---|
| $A_g$ | $A_g$ | $B_{1g}$ | $B_{2g}$ | $B_{3g}$ | $A_u$ | $B_{1u}$ | $B_{2u}$ | $B_{3u}$ |
| $B_{1g}$ | $B_{1g}$ | $A_g$ | $B_{3g}$ | $B_{2g}$ | $B_{1u}$ | $A_u$ | $B_{3u}$ | $B_{2u}$ |
| $B_{2g}$ | $B_{2g}$ | $B_{3g}$ | $A_g$ | $B_{1g}$ | $B_{2u}$ | $B_{3u}$ | $A_u$ | $B_{1u}$ |
| $B_{3g}$ | $B_{3g}$ | $B_{2g}$ | $B_{1g}$ | $A_g$ | $B_{3u}$ | $B_{2u}$ | $B_{1u}$ | $A_u$ |
| $A_u$ | $A_u$ | $B_{1u}$ | $B_{2u}$ | $B_{3u}$ | $A_g$ | $B_{1g}$ | $B_{2g}$ | $B_{3g}$ |
| $B_{1u}$ | $B_{1u}$ | $A_u$ | $B_{3u}$ | $B_{2u}$ | $B_{1g}$ | $A_g$ | $B_{3g}$ | $B_{2g}$ |
| $B_{2u}$ | $B_{2u}$ | $B_{3u}$ | $A_u$ | $B_{1u}$ | $B_{2g}$ | $B_{3g}$ | $A_g$ | $B_{1g}$ |
| $B_{3u}$ | $B_{3u}$ | $B_{2u}$ | $B_{1u}$ | $A_u$ | $B_{3g}$ | $B_{2g}$ | $B_{1g}$ | $A_g$ |

FIG. 3

Determine a reference state of a $BeH_2$ molecule and N excitations states corresponding to the reference state — 401

Determine an irreducible representation of the reference state of the $BeH_2$ molecule and an irreducible representation of each of the 90 excitations states — 402

Based on the irreducible representation of the reference state of the $BeH_2$ molecule and the irreducible representation of each of the 90 excitations states, determine, from the 90 excitations states, an excitations state whose irreducible representation is the same as the irreducible representation of the reference state of the $BeH_2$ molecule — 403

Generate a first quantum circuit by using the 23 excitations states — 404

FIG. 4

QUANTUM CIRCUIT GENERATION METHOD AND RELATED DEVICE

CROSS-REFERENCE TO RELATED APPLICATIONS

This disclosure is a continuation of International Patent Application No. PCT/CN2020/129127 filed on Nov. 16, 2020, which claims priority to Chinese Patent Application No. 201911119363.6 filed on Nov. 15, 2019. The disclosures of the aforementioned applications are hereby incorporated by reference in their entireties.

TECHNICAL FIELD

This disclosure relates to the quantum computer field, and in particular, to a quantum circuit generation method and a related device.

BACKGROUND

A quantum computer is a new type of computer based on features of quantum mechanics such as quantum superposition and quantum entanglement. Within several hours or even several minutes, the quantum computer can complete a computing task that would take an existing classical computer tens of thousands of years. At an application level, quantum computers can be applied in the fields of research and development of new materials, drug design, cryptosystems, complex optimization scheduling and the like. Top technology companies in the world, and countries such as China, the United States, the European Union, and the United Kingdom, are investing heavily in quantum computer research.

Quantum chemistry is a subject that studies chemical problems based on principles of quantum mechanics. Quantum chemistry is a subject that solves a Schrödinger equation to obtain a wave function describing electron distribution in molecules, and further studies chemical properties of the molecules based on the wave function. Quantum chemical simulation can be based on a quantum computer or a quantum computer simulator running in a classical computer to simulate a process of solving a ground state of molecules. Quantum chemical simulation may be the first to demonstrate computing power of a quantum computer.

A variational quantum eigensolver (VQE) is a method for solving the ground state in quantum chemistry simulation. The VQE can combine advantages of the quantum computer and the classical computer. The quantum computer prepares and measures an ansatz based on a quantum circuit. The classical computer summates energy values corresponding to ansatz measurements, updates parameters by using an optimization algorithm, and feeds back updated parameters to the quantum computer. This cycle is repeated until energy converges. A depth of the quantum circuit is directly proportional to a quantity of excitations states. If there are more excitations states, the depth of the quantum circuit is greater, more quantum gates are needed, and more resources are consumed.

SUMMARY

This disclosure provides a quantum circuit generation method and a related device, to reduce a depth of a generated quantum circuit, reduce a quantity of quantum gates and a quantity of layers, improve computation efficiency, and reduce resource consumption.

According to a first aspect, an embodiment of this disclosure provides a quantum circuit generation method, including determining a reference state of a target molecule and N excitations states corresponding to the reference state, where N is a positive integer greater than or equal to 1, determining M excitations states from the N excitations states based on an attribute of the reference state and attributes of the N excitations states, where M is a positive integer greater than or equal to 1 and less than or equal to N, and generating a first quantum circuit based on the M excitations states. The foregoing technical solution can reduce a quantity of excitations states used to generate the first quantum circuit, thereby reducing a depth of the quantum circuit, reducing a quantity of quantum gates and a quantity of layers, improving computation efficiency, and reducing resource consumption.

With reference to the first aspect, in a possible implementation of the first aspect, determining M excitations states from the N excitations states based on an attribute of the reference state and attributes of the N excitations states includes determining an irreducible representation of the reference state and an irreducible representation of each of the N excitations states, and determining the M excitations states from the N excitations states based on the irreducible representation of the reference state and the irreducible representation of each of the N excitations states, where an irreducible representation of each of the M excitations states is the same as the irreducible representation of the reference state.

With reference to the first aspect, in a possible implementation of the first aspect, determining an irreducible representation of the reference state and an irreducible representation of each of the N excitations states includes determining the irreducible representation of the reference state based on a group table and molecular orbital information of the reference state of the target molecule, and determining the irreducible representation of each of the N excitations states based on the group table and the molecular orbital information of each of the N excitations states. Determining the irreducible representations of the excitations state and the reference state by using the group table is easy to implement, and time consumption thereof is low.

With reference to the first aspect, in a possible implementation of the first aspect, generating a first quantum circuit based on the M excitations states includes determining energy of the reference state and energy obtained after the reference state is corrected by each of the M excitations states, separately obtaining a difference between the energy obtained after the reference state is corrected by each of the M excitations states and the energy of the reference state, to obtain M energy differences corresponding to the M excitations states, sorting the M excitations states in descending order of absolute values of the M energy differences, to obtain sorted M excitations states, determining T excitations states from the sorted M excitations states based on the M energy differences and a first preset energy threshold, where the T excitations states are a first excitations state to a $T^{th}$ excitations state among the sorted M excitations states, an absolute value of an energy difference corresponding to each of the T excitations states is greater than or equal to the first preset energy threshold, absolute values of energy differences corresponding to a $(T+1)^{th}$ excitations state to an $M^{th}$ excitations state among the sorted M excitations states are less than the first preset energy threshold, and T is a positive integer greater than or equal to 1 and less than M, and generating the first quantum circuit based on the T excitations states.

With reference to the first aspect, in a possible implementation of the first aspect, determining M excitations states from the N excitations states based on an attribute of the reference state and attributes of the N excitations states includes determining energy of the reference state and energy obtained after the reference state is corrected by each of the N excitations states, separately obtaining a difference between the energy obtained after the reference state is corrected by each of the N excitations states and the energy of the reference state, to obtain N energy differences corresponding to the N excitations states, and determining the M excitations states from the N excitations states based on the N energy differences and a first preset energy threshold, where an absolute value of an energy difference corresponding to each of the M excitations states is greater than or equal to the first preset energy threshold.

With reference to the first aspect, in a possible implementation of the first aspect, determining the M excitations states from the N excitations states based on the N energy differences and a first preset energy threshold includes sorting the N excitations states in descending order of absolute values of the N energy differences, to obtain sorted N excitations states, and determining the M excitations states from the sorted N excitations states based on the absolute values of the N energy differences and the first preset energy threshold, where the M excitations states are a first excitations state to an $M^{th}$ excitations state among the sorted N excitations states, and absolute values of energy differences corresponding to an $(M+1)^{th}$ excitations state to an $N^{th}$ excitations state among the sorted N excitations states are less than the first preset energy threshold.

With reference to the first aspect, in a possible implementation of the first aspect, the method further includes computing a first molecular ground state energy value based on the first quantum circuit, determining that a difference between the first molecular ground state energy value and a reference molecular ground state energy value is greater than a second preset energy threshold, and generating a second quantum circuit based on the M excitations states and the $(M+1)^{th}$ excitations state to an $(M+K)^{th}$i excitations state among the sorted N excitations states, where K is a positive integer greater than or equal to 1, and a sum of M and K is less than or equal to N. The quantum circuit determined based on the foregoing technical solution can enable chemical precision of a unitary coupled cluster of single and double excitations (UCCSD)-VQE computation result to meet a preset requirement.

According to a second aspect, an embodiment of this disclosure provides a computer device. The computer device includes modules configured to implement the method in the first aspect or any possible implementation of the first aspect.

According to a third aspect, an embodiment of this disclosure provides a computer apparatus. The computer apparatus includes units configured to implement the method in the first aspect or any possible implementation of the first aspect. The computer apparatus may be a computer device or a component (for example, a chip or a circuit) used for a computer device.

According to a fourth aspect, an embodiment of this disclosure provides a computer device, including a transceiver and a processor. Optionally, the computer device further includes a memory. The processor is configured to control the transceiver to send and receive signals. The memory is configured to store a computer program. The processor is configured to invoke the computer program from the memory and run the computer program, so that the computer device performs the method in the first aspect or any possible implementation of the first aspect.

According to a fifth aspect, an embodiment of this disclosure provides a computer system. The computer system may include a quantum computer and a classical computer, or may include a component used for a quantum computer and a component used for a classical computer. The computer system may implement the method in the first aspect or any possible implementation of the first aspect.

According to a sixth aspect, an embodiment of this disclosure provides a chip, including a logic circuit, where the logic circuit is configured to be coupled to an input/output interface, and transmit data by using the input/output interface, to perform the method in the first aspect or any possible implementation of the first aspect.

According to a seventh aspect, an embodiment of this disclosure provides a computer readable medium, where the computer readable medium stores computer program code, and when the computer program code runs on a computer, the computer is enabled to perform the method in the first aspect or any possible implementation of the first aspect.

BRIEF DESCRIPTION OF DRAWINGS

FIG. 3 is a schematic diagram of a group table;

FIG. 4 is a schematic flowchart of a quantum circuit generation method according to an embodiment of this disclosure;

DESCRIPTION OF EMBODIMENTS

Figure 1A:
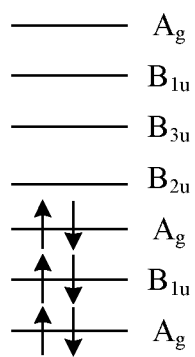
FIG. 1A, FIG. 1B, and FIG. 1C are schematic diagrams of electron arrangements of a molecule in three different states.

The following describes technical solutions of this disclosure with reference to accompanying drawings.

All aspects, embodiments, or features are presented in this disclosure by describing a system that may include multiple devices, components, modules, and the like. It should be appreciated and understood that, each system may include another device, component, module, and the like, and/or may not include all devices, components, modules, and the like discussed with reference to the accompanying drawings. In addition, a combination of these solutions may be used.

In addition, in the embodiments of this disclosure, words such as "example" and "for example" are used to represent examples, illustrations, or descriptions. Any embodiment or design scheme described as an "example" in this disclosure should not be explained as being more preferred or having more advantages than another embodiment or design scheme. Exactly, "for example" is used to present a concept in a specific manner.

In the embodiments of this disclosure, "corresponding (relevant)" and "corresponding" may be used interchangeably sometimes. It should be noted that meanings to be expressed are consistent when a difference between the words is not emphasized.

In the embodiments of this disclosure, sometimes a subscript such as W1 may be presented in a non-subscript form such as W1 by mistake. When a difference between the forms is not emphasized, meanings to be expressed by the forms are consistent.

The network architecture and the service scenario described in the embodiments of this disclosure are intended to describe the technical solutions in the embodiments of this disclosure more clearly, and do not constitute a limitation on the technical solutions provided in the embodiments of this disclosure. A person of ordinary skill in the art may know that with the evolution of the network architecture and the emergence of new service scenarios, the technical solutions provided in the embodiments of this disclosure are also applicable to similar technical problems.

Reference to "an embodiment", "some embodiments", or the like described in this specification means that one or more embodiments of this disclosure include a specific feature, structure, or characteristic described with reference to the embodiments. Therefore, statements such as "in one embodiment", "in some embodiments", and "in some other embodiments" that appear in different positions in this specification do not necessarily all refer to the same embodiments, but rather mean "one or more but not all embodiments", unless otherwise emphasized. The terms "include", "contain", "have", and variations thereof all mean "including but not limited to", unless otherwise emphasized.

In this disclosure, the term "at least one" indicates one or more, and the term "a plurality of" indicates two or more. "and/or" describes an association relationship of associated objects, and indicates that there may be three relationships. For example, A and/or B may indicate a case in which only A exists, both A and B exist, and only B exists, where A and B may be singular or plural. The character "/" generally indicates an "or" relationship between the associated objects. The term "at least one of the following items (pieces)" or an expression similar to the term indicates any combination of the items, and includes a single item (piece) or any combination of a plurality of items (pieces). For example, at least one item (piece) of a, b, or c may indicate: a, b, c, a-b, a-c, b-c, or a-b-c, where a, b, and c may be in a singular or plural form.

To help a person skilled in the art better understand the technical solutions of this disclosure, some basic concepts in this disclosure are first briefly described.

Schrödinger Equation:

The Schrödinger equation, also referred to as a Schrödinger wave equation, is a fundamental equation in quantum mechanics proposed by Austrian physicist Schrödinger, and also a basic hypothesis in quantum mechanics. Quantum chemistry is a subject that applies principles of quantum mechanics to study chemical problems, including molecular structures, molecular interactions, collisions, chemical reactions, and the like. One of the most important problems in classical chemical computation is to solve ground state energy. In principle, computational chemistry is simple enough to express a corresponding exact Schrödinger equation. However, in practice, because of an exponential increase of computing resources, a scale of a molecule to be precisely solved is very small. Therefore, it is difficult to solve a multi-body Schrödinger equation by using a classical computer. In essence, a molecular system is a quantum system, and simulating the quantum system by using a quantum computer is more efficient. Features such as quantum superposition and quantum entanglement based on the quantum computer can accelerate a solution to a molecular ground state problem and a solution to an exponential wall problem in a classical method such as a full configuration interaction method. Furthermore, due to scarcity of quantum resources, the industry focuses on using a VQE to solve a ground state wave function. For the VQE, a good ansatz can greatly reduce a quantity of iterations, so that the wave function can quickly converge to an ideal unknown ground state wave function.

Ansatz:

In the ansatz, a hypothesis is made first, and a series of calculus is performed based on this hypothesis, and then an obtained result is used to test whether the initial hypothesis is true. When it is difficult to directly solve a problem, the ansatz is often a starting point for solving the problem.

Wave Function:

The wave function Y describing a motion status of electrons in a molecule may be obtained by solving the Schrödinger equation. Y is referred to as a molecular orbital.

Molecular Orbital:

Each molecular orbital describes distribution of an electron in space, and an eigenvalue corresponding to the molecular orbital is energy of the molecular orbital. If the energy is lower, stability is higher.

State:

By solving the Schrödinger equation for molecules in an approximation, a series of molecular orbitals with energy arranged from high to low can be solved for a particular molecule. Each orbital can contain a maximum of two electrons, and spins of the two electrons need to be different. Different arrangements of electrons in this series of molecular orbitals can make up different states.

Ground State:

In quantum mechanics, a system (for example, an atom or a molecule) may be in one or more superposition states of a series of quantum states, where a quantum state with lowest energy is referred to as the ground state.

Reference State:

Among all states, a state with lowest energy and highest stability may be referred to as the reference state. In molecular orbitals corresponding to the reference state, all electrons are arranged in order starting from an orbital lowest energy. The reference state is not necessarily a ground state. When the Schrödinger equation is solved, an approximation is introduced. Therefore, the solved state with lowest energy is not necessarily a real ground state. The real ground state needs to be described by several different states including the reference state together.

Single Excitations:

In comparison with the reference state, one electron is arranged in a different orbital. This is equivalent to transition of one electron in the reference state to an orbital with higher energy.

Double Excitations:

In comparison with the reference state, two electrons are arranged in a different orbital. This is equivalent to transition of two electrons in the reference state to an orbital with higher energy.

Single Excitations State:

A state formed after the reference state undergoes single excitations is referred to as the single excitations state.

Double Excitations State:

A state formed after the reference state undergoes double excitations is referred to as the double excitations state.

The single excitations state and the double excitations state may be collectively referred to as an excitations state.

Figure 1B:
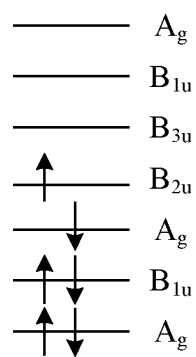
Figure 1C:
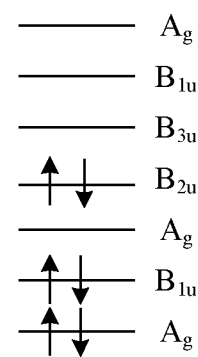

FIGS. 1A-1C are schematic diagrams of electron arrangements of a molecule in three different states. As shown in FIGS. 1A-1C, FIGS. 1A-1C are respectively schematic diagrams of electron arrangements of a beryllium hydride ($BeH_2$) molecule in three different states. According to a point group theory, the $BeH_2$ molecule has D2h symmetry. The D2h symmetry has eight different irreducible representations: $A_g$, $B_{1g}$, $B_{2g}$, $B_{3g}$, $A_u$, $B_{1u}$, $B_{2u}$, and $B_{3u}$. The $BeH_2$ molecule has a total of seven molecular orbitals in a STO-3G group. In FIGS. 1A-1C respectively show schematic diagrams of molecular orbitals of the $BeH_2$ molecule in a reference state, a single excitations state, and a double excitations state, and an irreducible representation of each molecular orbital. The seven molecular orbitals shown in FIGS. 1A-1C are arranged in ascending order of energy, and the irreducible representations are $A_g$, $B_{1u}$, $A_g$, $B_{2u}$, $B_{3u}$, $B_{1u}$, and $A_g$. For ease of description, the seven molecular orbitals in ascending order of energy values are referred to as the first molecular orbital to the seventh molecular orbital. In other words, among the seven molecular orbitals, the first molecular orbital has a lowest energy value, and the seventh molecular orbital has a highest energy value.

In FIG. 1A shows an electron arrangement of the $BeH_2$ molecule in the reference state. Three molecular orbitals with lowest energy (that is, the first molecular orbital to the third molecular orbital) are double occupied (that is, there are two electrons), and the remaining four molecular orbitals are empty orbitals (there is no electron).

In FIG. 1B shows an electron arrangement of the $BeH_2$ molecule in the single excitations state. It can be learned that one electron in the third orbital in the reference state transitions to the fourth orbital, thereby forming the single excitations state shown in FIG. 1B.

In FIG. 1C shows an electron arrangement of the $BeH_2$ molecule in the double excitations state. It can be learned that two electrons in the third orbital in the reference state transition to the fourth orbital, thereby forming the double excitations state shown in FIG. 1C.

Unitary coupled cluster algorithm considering single and double excitations.

The UCCSD algorithm is an improvement over a conventional coupled cluster (CC) algorithm to adapt to unitary evolution of a quantum computer. A unitary coupled cluster (UCC) algorithm is an improvement over the conventional CC algorithm, so that the UCC algorithm can run on the quantum computer. The UCCSD algorithm, as a UCC algorithm considering the single excitations state and the double excitations state, is a subclass of the UCC algorithm.

Figure 2:
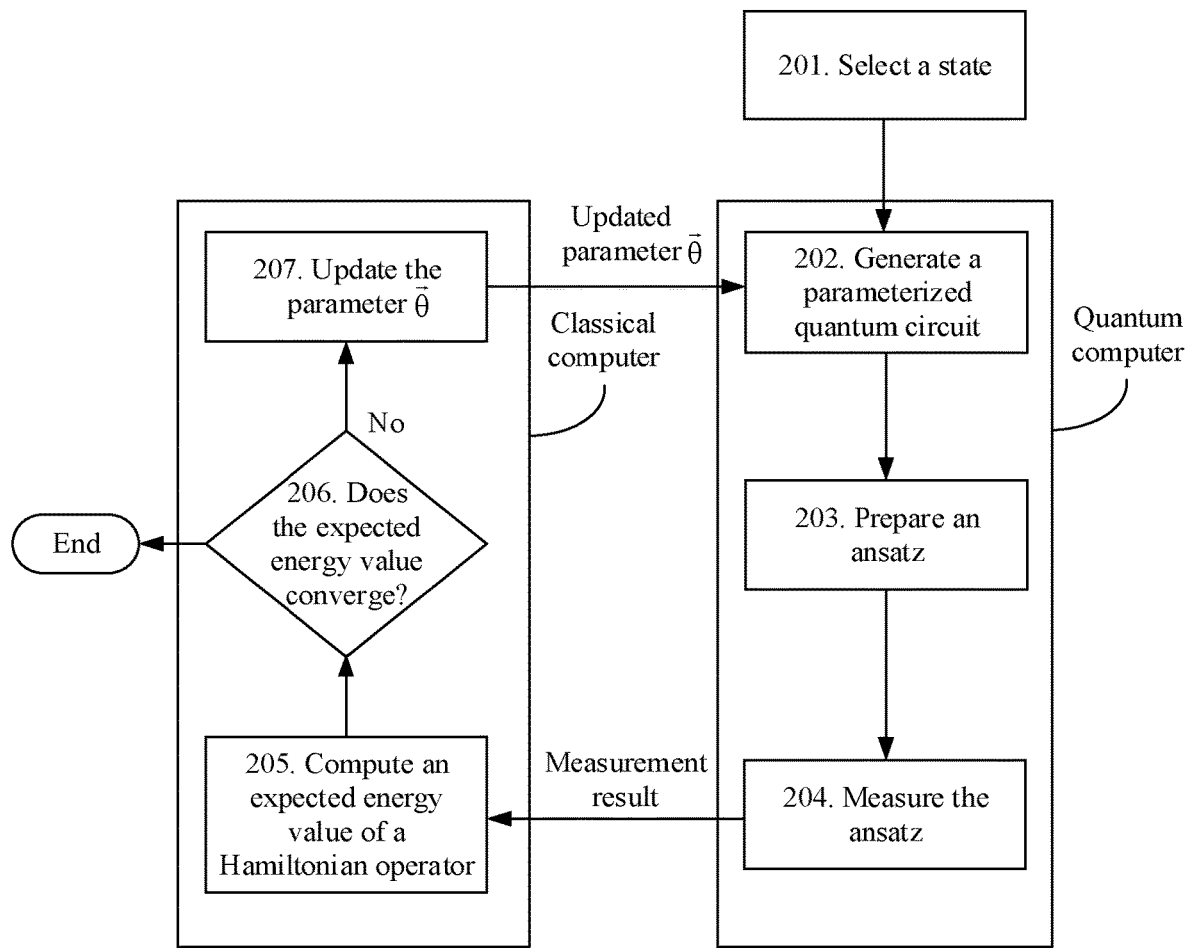
FIG. 2 is a schematic flowchart for performing computation by using a UCCSD-VQE method according to an embodiment of this disclosure.

FIG. 2 is a schematic flowchart for performing computation by using a UCCSD-VQE method according to an embodiment of this disclosure.

201. Select a state of a target molecule.

202. Use the selected state and a parameter θ to generate a parameterized quantum circuit.

203. Apply the parameterized quantum circuit to a reference state to prepare an ansatz.

204. Measure the prepared ansatz and transmit measurement data to a classical computer.

The measuring the prepared ansatz may include measuring an expected value of each Hamiltonian sub-operator in the ansatz.

In quantum mechanics, a Hamiltonian operator is an observable quantity, and corresponds to total energy of a system.

205. Compute an expected energy value of the Hamiltonian operator based on the obtained measurement data.

206. Determine the expected energy value of the Hamiltonian operator, and if the expected energy value converges, terminate a UCCSD-VQE computation process, or if the expected energy value does not converge, perform step 206.

Meanings of the energy and the expected energy value in this embodiment of this disclosure are the same.

207. Update the parameter θ, and send an updated parameter θ to a quantum computer.

The classical computer may use an optimization algorithm such as a conjugate gradient algorithm, a stochastic gradient algorithm, or a limited memory Broyden-Fletcher-Goldfarb-Shanno (BFGS) (L-BFGS) algorithm to optimize the parameter θ, and send the updated parameter θ to the quantum computer.

After the quantum computer receives the updated parameter θ, the quantum computer continues to perform the foregoing procedure, until the expected energy value of the Hamiltonian operator converges.

Step 202, step 203, and step 204 may be implemented by the quantum computer or a quantum computer simulator running in the classical computer. Step 205 to step 207 may be implemented by the classical computer. Step 201 may be implemented by the classical computer, or may be implemented by the classical computer and the quantum computer together.

The UCCSD-VQE method shown in FIG. 2 may be used for molecular simulation, material design, drug screening, and the like.

Quantum Circuit:

The quantum circuit is a line for performing an operation on a quantum information storage unit (for example, a quantum bit). The quantum circuit may include a quantum information storage unit, a line (or a timeline), and various quantum gates (or logic gates). A quantity of states determined in step 201 in the UCCSD-VQE method shown in FIG. 2 is directly proportional to a depth of the quantum circuit, a quantity of quantum gates, and a quantity of layers.

Point Group:

The point group is a set of symmetric operations used to describe symmetry of an object. These operations (such as rotation and reflection) move the object relative to a fixed center to keep the object unchanged. There are 32 types of point groups, each of which has a corresponding symbol mark (for example, Cn, Cnv, Dn, and Dnh, where n is a positive integer).

Irreducible Representation:

A representation of a group is reducible if all its matrices can be transformed into diagonal square matrices of a same form by means of a similar transformation, otherwise, the representation is irreducible. Each point group includes group elements of several irreducible representations. In this disclosure, each state corresponds to only one irreducible representation, but different states may correspond to a same irreducible representation. An irreducible representation of a state may be determined by using a group table.

Group Table:

This table records all possible multiplication results of all elements in a group.

FIG. 3 is a schematic diagram of a group table.

Irreducible representations of the three states shown in FIGS. 1A-1C may be determined by using the group table shown in FIG. 3.

For example, in the reference state of the $BeH_2$ molecule shown in FIG. 1A, the first orbital, the second orbital, and the third orbital all include two electrons. Therefore, based on molecular orbital information (that is, an electron arrangement) of the reference state of the $BeH_2$ molecule, it may be determined that an irreducible representation of the reference state of the $BeH_2$ molecule is $(A_g \cdot A_g) \cdot (B_{1u} \cdot B_{1u}) \cdot (A_g \cdot A_g)$. Referring to the group table shown in FIG. 3, a result of $A_g \cdot A_g$ is $A_g$, and a result of $B_{1u} \cdot B_{1u}$ is $A_g$. Therefore, the reference state of the $BeH_2$ molecule may be represented as $A_g \cdot A_g \cdot A_g$. Because the result of Age $A_g$ is $A_g$, $A_g \cdot A_g \cdot A_g$ may be represented as $A_g \cdot A_g$. Because the result of $A_g \cdot A_g$ is $A_g$, the irreducible representation of the reference state of the $BeH_2$ molecule may be $A_g$.

Similarly, by using the group table shown in FIG. 3 and molecular orbital information of the single excitations state of the $BeH_2$ molecule shown in FIG. 1B, an irreducible representation of the single excitations state of the $BeH_2$ molecule shown in FIG. 1B may also be obtained. The irreducible representation of the single excitations state of the $BeH_2$ molecule is $B_{2u}$. By using the group table shown in FIG. 3 and molecular orbital information of the double excitations state of the $BeH_2$ molecule shown in FIG. 1C, an irreducible representation of the double excitations state of the $BeH_2$ molecule shown in FIG. 1C may also be obtained. The irreducible representation of the double excitations state of the $BeH_2$ molecule is $A_g$.

An embodiment of this disclosure provides a quantum circuit generation method. The method according to this embodiment of this disclosure can reduce a depth of a quantum circuit, reduce a quantity of quantum gates and a quantity of layers, improve computation efficiency, and reduce resource consumption.

The following uses $BeH_2$ as an example to describe how to generate a quantum circuit.

FIG. 4 is a schematic flowchart of a quantum circuit generation method according to an embodiment of this disclosure.

401. Determine a reference state of a $BeH_2$ molecule and N excitations states corresponding to the reference state.

The $BeH_2$ molecule includes a total of six electrons. Molecular orbitals of the $BeH_2$ molecule include seven orbitals, where three orbitals are occupied orbitals (that is, there are electrons), and four orbitals are empty orbitals (that is, there is no electron). Therefore, the $BeH_2$ molecule may have 12 single excitations states, and 78 double excitations states. Therefore, the $BeH_2$ molecule has a total of 90 excitations states. In other words, a value of N is 90.

402. Determine an irreducible representation of the reference state of the $BeH_2$ molecule and an irreducible representation of each of the 90 excitations states.

For a manner of determining the irreducible representation of the reference state of the $BeH_2$ molecule and the irreducible representations of the states, refer to the foregoing embodiment. For brevity, details are not described herein again.

403. Based on the irreducible representation of the reference state of the $BeH_2$ molecule and the irreducible representation of each of the 90 excitations states, determine, from the 90 excitations states, an excitations state whose irreducible representation is the same as the irreducible representation of the reference state of the $BeH_2$ molecule.

The two excitations states of the $BeH_2$ molecule shown in FIGS. 1A-1C are still used as an example. As described above, the irreducible representation of the single excitations state of the $BeH_2$ molecule shown in FIG. 1B is $B_{2u}$, and the irreducible representation of the double excitations state of the $BeH_2$ molecule shown in FIG. 1C is $A_g$. It can be learned that the irreducible representation of the single excitations state is different from the irreducible representation of the reference state of the $BeH_2$ molecule, and the irreducible representation of the double excitations state is the same as the irreducible representation of the reference state of the $BeH_2$ molecule.

Finally, irreducible representations of only 23 excitations states among the 90 excitations states are the same as the irreducible representation of the reference state of the $BeH_2$ molecule.

404. Generate a first quantum circuit by using the 23 excitations states.

A specific implementation of generating a quantum circuit by using an excitations state is the same as an existing specific implementation of generating a quantum circuit by using an excitations state. For brevity, details are not described herein again.

Step 401 to step 403 may be implemented by a classical computer or a component (for example, a chip or a circuit) in a classical computer. Step 404 may be implemented by a quantum computer or a quantum computer simulator running in a classical computer.

In the method shown in FIG. 4, excitations states whose irreducible representations are the same can be screened out from a plurality of excitations states corresponding to a reference state of a target molecule (that is, the $BeH_2$ molecule). The first quantum circuit is generated by using the excitations states that are screened out. This can reduce a quantity of excitations states used to generate the first quantum circuit, thereby reducing a depth of the quantum circuit, reducing a quantity of quantum gates and a quantity of layers, improving computation efficiency, and reducing resource consumption. For ease of description, the method shown in FIG. 4 may be referred to as a symmetry reduction method. Table 1 shows a quantity of quantum gates (that is, single-bit gates and double-bit gates) determined without using the symmetry reduction method, a quantity of quantum gates determined by using the symmetry reduction method, and simulation time consumption when the target molecule is a $BeH_2$ molecule.

TABLE 1

| $BeH_2$ | Without using symmetry reduction | After symmetry reduction | Ratio after/before symmetry reduction |
| --- | --- | --- | --- |
| Parameter quantity | 90 | 23 | 25.6% |
| Double-bit gate | 18208 | 2528 | 13.9% |
| Single-bit gate | 13200 | 2364 | 17.9% |
| Simulation time consumption | 319 s | 73 s | 22.9% |

It can be learned that after the symmetry reduction method shown in FIG. 4 is used, a quantity of used quantum gates and simulation time consumption can be greatly reduced.

Table 2 shows a quantity of quantum gates (that is, single-bit gates and double-bit gates) determined without using the symmetry reduction method and a quantity of quantum gates determined by using the symmetry reduction method when the target molecule is a helium hydrogen ion ($HeH^+$).

TABLE 2

| HeH+ | Without using symmetry reduction | After symmetry reduction | Ratio after/before symmetry reduction |
|---|---|---|---|
| Parameter quantity | 54 | 26 | 48.1% |
| Double-bit gate | 11136 | 4480 | 40.2% |
| Single-bit gate | 6012 | 2476 | 41.2% |

Table 3 shows a quantity of quantum gates (that is, single-bit gates and double-bit gates) determined without using the symmetry reduction method and a quantity of quantum gates determined by using the symmetry reduction method when the target molecule is a water ($H_2O$) molecule.

TABLE 3

| $H_2O$ | Without using symmetry reduction | After symmetry reduction | Ratio after/before symmetry reduction |
|---|---|---|---|
| Parameter quantity | 65 | 26 | 40.0% |
| Double-bit gate | 12240 | 3504 | 28.6% |
| Single-bit gate | 8840 | 2960 | 33.5% |

Figure 5:
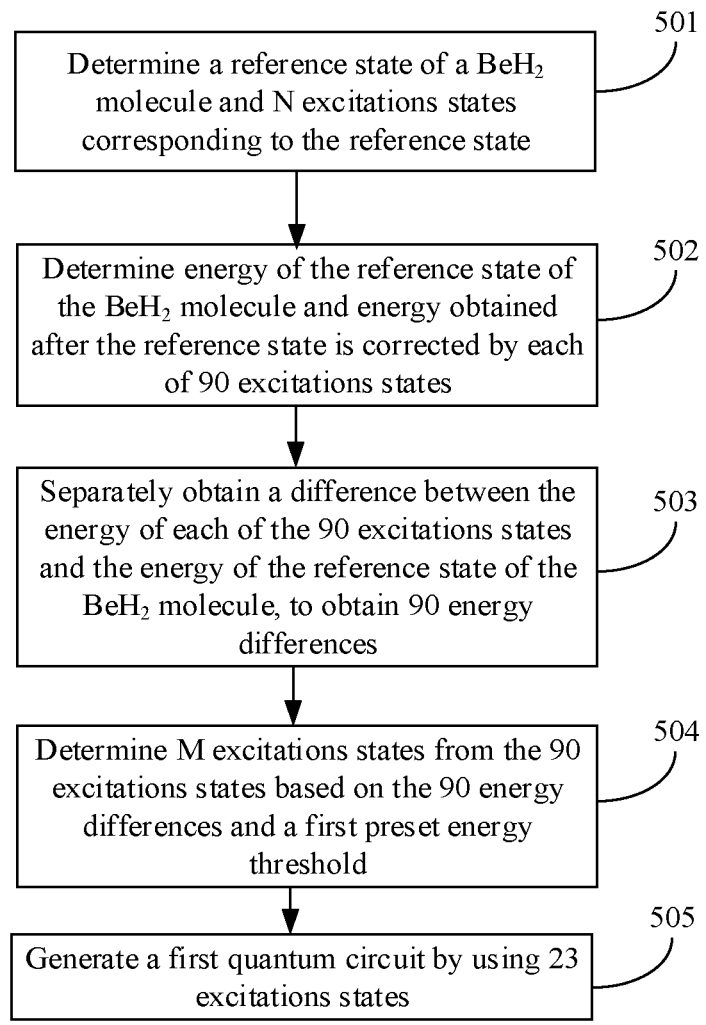
FIG. 5 is a schematic flowchart of another quantum circuit generation method according to an embodiment of this disclosure.

FIG. 5 is a schematic flowchart of another quantum circuit generation method according to an embodiment of this disclosure.

501. Determine a reference state of a $BeH_2$ molecule and N excitations states corresponding to the reference state.

The $BeH_2$ molecule includes a total of six electrons. Molecular orbitals of the $BeH_2$ molecule include seven orbitals, where three orbitals are occupied orbitals (that is, there are electrons), and four orbitals are empty orbitals (that is, there is no electron). Therefore, the $BeH_2$ molecule may have 12 single excitations states, and 78 double excitations states. Therefore, the $BeH_2$ molecule has a total of 90 excitations states. In other words, a value of N is 90.

502. Determine energy of the reference state of the $BeH_2$ molecule and energy obtained after the reference state is corrected by each of the 90 excitations states.

The reference state of the $BeH_2$ molecule corresponds to an initialization parameter. Convergent energy obtained by running a UCCSD-VQE by using the initialization parameter and the reference state of the $BeH_2$ molecule is the energy of the reference state of the $BeH_2$ molecule.

Similarly, each of the 90 excitations states corresponds to an initialization parameter. Convergent energy obtained by running the UCCSD-VQE by using an excitations state and an initialization parameter corresponding to the excitations state is energy obtained after the reference state is corrected by the excitations state.

503. Separately obtain a difference between the energy obtained after the reference state is corrected by each of the 90 excitations states and the energy of the reference state of the $BeH_2$ molecule, to obtain 90 energy differences.

For example, assuming that $E_n$ represents energy obtained after the reference state is corrected by an $n^{th}$ excitations state among the 90 excitations states and that $E_R$ represents the energy of the reference state, where n is a positive integer greater than or equal to 1 and less than or equal to 90, an energy difference corresponding to the $n^{th}$ excitations state is $E_n - E_R$.

504. Determine M excitations states from the 90 excitations states based on the 90 energy differences and a first preset energy threshold, where an absolute value of an energy difference corresponding to each of the M excitations states is greater than or equal to the first preset energy threshold.

For ease of description, an excitations state corresponding to an energy difference greater than the first preset energy threshold is hereinafter referred to as a first target excitations state.

Optionally, in some embodiments, determining M excitations states from the 90 excitations states based on the 90 energy differences and a first preset energy threshold includes sequentially determining whether each of the 90 energy differences is greater than the first preset energy threshold, and if the energy difference is greater than the first preset energy threshold, determining that an excitations state corresponding to the energy difference is the first target excitations state. Through the foregoing process, the M target excitations states may be determined from the 90 excitations states.

Optionally, in other embodiments, determining M excitations states from the 90 excitations states based on the 90 energy differences and a first preset energy threshold includes sorting the 90 excitations states in descending order of absolute values of the 90 energy differences, to obtain sorted 90 excitations states. An absolute value of an energy difference corresponding to a first excitations state among the sorted 90 excitations states is the largest, and an absolute value of an energy difference corresponding to a $90^{th}$ excitations state is the smallest. The M excitations states are determined from the sorted 90 excitations states based on the 90 energy differences and the first preset energy threshold, where the M excitations states are the first excitations state to an $M^{th}$ excitations state among the sorted 90 excitations states, and absolute values of energy differences corresponding to an $(M+1)^{th}$ excitations state to the $90^{th}$ excitations state among the sorted 90 excitations states are less than the first preset energy threshold. In other words, one reference energy difference may be determined from the 90 energy differences, and an absolute value of the reference energy difference is greater than or equal to the first preset energy threshold. An absolute value of an energy difference whose absolute value is less than the absolute value of the reference energy difference, among the 90 energy differences, is less than the first preset energy threshold. An excitations state corresponding to the reference energy difference is the $M^{th}$ excitations state among the sorted 90 excitations states. All excitations states ranked before the $M^{th}$ excitations state are the first target excitations states.

For example, an absolute value of an energy difference corresponding to a $23^{rd}$ excitations state among the sorted 90 excitations states is greater than the first preset energy threshold, and an absolute value of an energy difference corresponding to a $24^{th}$ excitations state is less than the first preset energy threshold. This means that an absolute value of an energy difference corresponding to any one of the first excitations state to the $23^{rd}$ excitations state among the sorted 90 excitations states is greater than or equal to the first preset energy threshold, and an absolute value of an energy difference corresponding to any one of the $24^{th}$ excitations state to the $90^{th}$ excitations state is less than the first preset energy threshold. In other words, in this case, 23 excitations states may be determined from the 90 excitations states. For ease of description, it is hereinafter assumed that M is equal to 23.

505. Generate a first quantum circuit by using the 23 excitations states.

A specific implementation of generating a quantum circuit by using an excitations state is the same as an existing specific implementation of generating a quantum circuit by using an excitations state. For brevity, details are not described herein again.

Steps 501, 503, and 504 may be implemented by a classical computer. Step 505 may be implemented by a quantum computer. Step 502 may be implemented by the classical computer and the quantum computer together. As described above, the energy of the reference state corrected by the excitations state and the energy of the reference state are obtained by running a UCCSD-VQE. As shown in FIG. 2, some operations in the UCCSD-VQE are implemented by the quantum computer, and some operations are implemented by the classical computer.

The foregoing technical solution can reduce a quantity of excitations states used to determine the quantum circuit, thereby reducing a depth of the quantum circuit, reducing a quantity of quantum gates and a quantity of layers, improving computation efficiency, and reducing resource consumption.

Optionally, in some embodiments, the first quantum circuit may be directly used as a quantum circuit finally used for UCCSD-VQE computation. For ease of description, the quantum circuit finally used for UCCSD-VQE computation is hereinafter referred to as a target quantum circuit.

Optionally, in other embodiments, UCCSD-VQE computation may be first performed based on the first quantum circuit, to obtain a first molecular ground state energy value, and whether a difference between the first molecular ground state energy value and a reference molecular ground state energy value is greater than a second preset energy threshold is determined. If the difference between the first molecular ground state energy value and the reference molecular ground state energy value is not greater than the second preset energy threshold, it indicates that chemical precision of a final result obtained by performing UCCSD-VQE computation based on the first quantum circuit meets a preset requirement. In this case, the first quantum circuit is the target quantum circuit. If the difference between the first molecular ground state energy value and the reference molecular ground state energy value is greater than the second preset energy threshold, it indicates that chemical precision of the final result obtained by performing UCCSD-VQE computation based on the first quantum circuit cannot meet the preset requirement. In this case, K excitations states may continue to be selected from the sorted 90 excitations states. K is a preset value. For example, K may be a number greater than or equal to 1, and a sum of K and M is less than or equal to 90. The K excitations states are K excitations states among the 90 excitations states other than the 23 excitations states used to generate the first quantum circuit. In other words, the K excitations states are K excitations states from the $24^{th}$ excitations state to the $90^{th}$ excitations state among the sorted 90 excitations states. The K excitations states may be top K excitations states among the 67 excitations states (that is, the $24^{th}$ excitations state to the $90^{th}$ excitations state among the sorted 90 excitations states). In this case, a second quantum circuit may be determined by using the 23 excitations states and the K excitations states.

For example, it is assumed that a value of K is 2. In this case, the second quantum circuit may be determined based on the first excitations state to a $25^{th}$ excitations state among the sorted 90 excitations states.

After the second quantum circuit is determined, whether chemical precision of a final result obtained by performing UCCSD-VQE computation based on the second quantum circuit meets the preset requirement may also continue to be determined. For example, UCCSD-VQE computation may be performed based on the second quantum circuit, to obtain a second molecular ground state energy value, and whether a difference between the second molecular ground state energy value and the reference molecular ground state energy value is greater than the second preset energy threshold is determined. If the difference between the second molecular ground state energy value and the reference molecular ground state energy value is not greater than the second preset energy threshold, it indicates that chemical precision of a final result obtained by performing UCCSD-VQE computation based on the second quantum circuit meets the preset requirement. In this case, the second quantum circuit is the target quantum circuit. If the difference between the second molecular ground state energy value and the reference molecular ground state energy value is greater than the second preset energy threshold, it indicates that chemical precision of the final result obtained by performing UCCSD-VQE computation based on the second quantum circuit cannot meet the preset requirement. For ease of description, the difference between the first molecular ground state energy value and the reference molecular ground state energy value may be referred to as a first reference energy difference, and the difference between the second molecular ground state energy value and the reference molecular ground state energy value is referred to as a second reference energy difference hereinafter. If the first reference energy difference is less than the second reference energy difference, it indicates that excessive excitations states are used to determine the second quantum circuit. In this case, a third quantum circuit may be determined by using excitations states more than those used to determine the first quantum circuit and fewer than those used to determine the second quantum circuit. For example, the third quantum circuit may be determined based on the first excitation line to the $24^{th}$ excitations state among the sorted 90 excitations states, and whether the third quantum circuit can be used as the target quantum circuit continues to be determined based on the reference molecular ground state energy value. If the first reference energy difference is greater than the second reference energy difference, it indicates that more excitations states may be used to determine a quantum circuit. In this case, a fourth quantum circuit may be determined by using excitations states more than those used to determine the second quantum circuit. For example, the fourth quantum circuit may be determined based on the first excitation line to a $28^{th}$ excitations state among the 90 excitations states, and whether the third quantum circuit can be used as the target quantum circuit continues to be determined based on the reference molecular ground state energy value.

The foregoing technical solution can ensure that precision of the finally determined result meets the requirement, while reducing the depth of the quantum circuit. For ease of description, a method for selecting, based on an energy difference, an excitations state for determining a quantum circuit as shown in FIG. 5 is hereinafter referred to as an energy sorting optimization method.

Optionally, in some embodiments, a symmetry reduction method and the energy sorting optimization method may also be combined to determine the quantum circuit.

The $BeH_2$ molecule is also used as an example. In some embodiments, the quantum circuit may be determined first by using the symmetry reduction method, and then by using the energy sorting optimization method. For example, 23 excitations states may be determined from the 90 excitations states, and an irreducible representation of each of the 23 excitations states is the same as an irreducible representation of the reference state of the $BeH_2$ molecule. Then the energy of the reference state of the $BeH_2$ molecule and energy obtained after the reference state is corrected by each of the 23 excitations states are determined. A difference between the energy obtained after the reference state is corrected by each of the 23 excitations states and the energy of the reference state of the $BeH_2$ molecule is obtained separately, so that 23 energy differences are obtained. An excitations state corresponding to an energy difference greater than or equal to the first preset energy threshold is determined from the 23 excitations states based on the 23 energy differences and the first preset energy threshold. Similarly, the 23 excitations states may be sorted by using absolute values of the 23 energy differences, so that sorted 23 excitations states are obtained, where an absolute value of an energy difference corresponding to a first excitations state among the sorted 23 excitations states is the largest, and an absolute value of an energy difference corresponding to a $23^{rd}$ excitations state is the smallest. It is assumed that energy differences corresponding to first 15 excitations states among the sorted 23 excitations states are greater than or equal to the first preset energy threshold. In this case, the quantum circuit may be determined based on the sorted first excitations state to a $15^{th}$ excitations state. If precision of the quantum circuit determined based on the first 15 excitations states does not meet the preset requirement, top one or more excitations states may continue to be selected from $16^{th}$ to $23^{rd}$ excitations states, and a new quantum circuit continues to be determined based on the one or more excitations states and the first 15 excitations states.

In some embodiments, the quantum circuit may be determined first by using the energy sorting optimization method, and then by using the symmetry reduction method. For example, it is assumed that 23 excitations states are determined by using the energy sorting optimization method. Then excitations states whose irreducible representations are the same as the irreducible representation of the reference state of the $BeH_2$ molecule are determined from the 23 excitations states. Assuming that irreducible representations of 10 of the 23 excitations states are the same as the irreducible representation of the reference state of the $BeH_2$ molecule, the 10 excitations states may be used to determine the quantum circuit. If precision of the quantum circuit determined based on the 10 excitations states does not meet the preset requirement, one or more top excitations states may continue to be selected from the $24^{th}$ to $90^{th}$ excitations states, and then an excitations state whose irreducible representation is the same as the irreducible representation of the reference state of the $BeH_2$ molecule is selected from the one or more excitations states. Assuming that the one or more excitations states include one excitations state whose irreducible representation is the same as the irreducible representation of the reference state of the $BeH_2$ molecule, a new quantum circuit may continue to be determined based on the one excitations state and the 10 excitations states.

Figure 6:
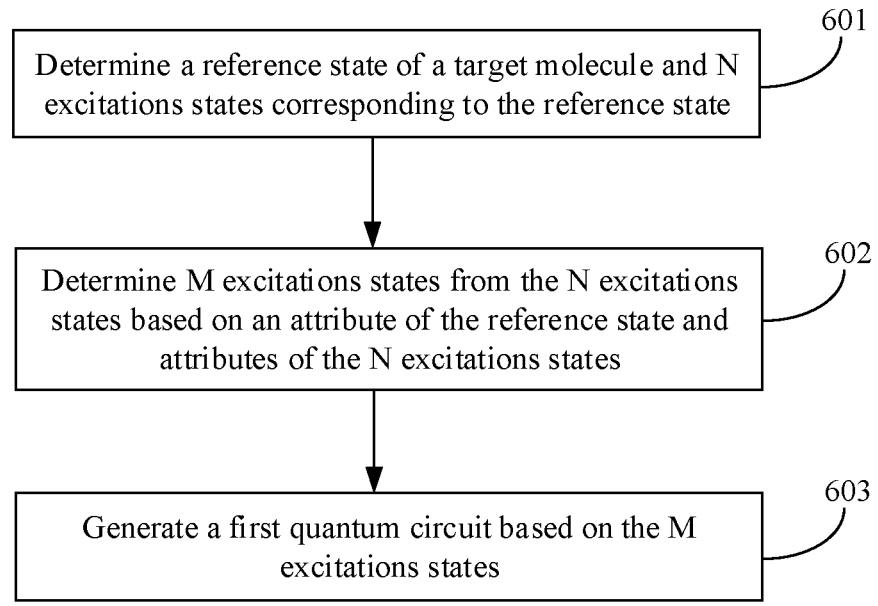
FIG. 6 is a schematic flowchart of a quantum circuit generation method according to an embodiment of this disclosure.

FIG. 6 is a schematic flowchart of a quantum circuit generation method according to an embodiment of this disclosure.

601. Determine a reference state of a target molecule and N excitations states corresponding to the reference state, where N is a positive integer greater than or equal to 1.

The target molecule may be a molecule, for example, a $BeH_2$ molecule or an $H_2O$ molecule, or may be an ion, for example, HeH+.

602. Determine M excitations states from the N excitations states based on an attribute of the reference state and attributes of the N excitations states, where M is a positive integer greater than or equal to 1 and less than or equal to N.

603. Generate a first quantum circuit based on the M excitations states.

Optionally, in some embodiments, the attribute of the reference state may be an irreducible representation of the reference state, and an attribute of an excitations state may be an irreducible representation of the excitations state. In this case, determining M excitations states from the N excitations states based on an attribute of the reference state and attributes of the N excitations states may include determining an irreducible representation of the reference state and an irreducible representation of each of the N excitations states, and determining the M excitations states from the N excitations states based on the irreducible representation of the reference state and the irreducible representation of each of the N excitations states, where an irreducible representation of each of the M excitations states is the same as the irreducible representation of the reference state.

For a method for determining the irreducible representation of the reference state and a method for determining the irreducible representation of the excitations state, refer to descriptions in the foregoing embodiment. For brevity, details are not described herein again.

Optionally, in some embodiments, determining an irreducible representation of the reference state and an irreducible representation of each of the N excitations states includes determining the irreducible representation of the reference state based on a group table and molecular orbital information of the reference state of the target molecule, and determining the irreducible representation of each of the N excitations states based on the group table and the molecular orbital information of each of the N excitations states. The irreducible representations of the excitations state and the reference state can be determined quickly by using the group table. For example, an irreducible representation of a reference state of the $BeH_2$ molecule can be obtained by looking up the table five times. Determining the irreducible representations of the excitations state and the reference state by using the group table is easy to implement, and time consumption thereof is low.

Optionally, in some embodiments, the method may further include generating a first quantum circuit based on the M excitations states by determining energy of the reference state and energy obtained after the reference state is corrected by each of the M excitations states, separately obtaining a difference between the energy obtained after the reference state is corrected by each of the M excitations states and the energy of the reference state, to obtain M energy differences corresponding to the M excitations states, sorting the M excitations states in descending order of absolute values of the M energy differences, to obtain sorted M excitations states, determining T excitations states from the sorted M excitations states based on the M energy differences and a first preset energy threshold, where the T excitations states are a first excitations state to a $T^{th}$ excitations state among the sorted M excitations states, an absolute value of an energy difference corresponding to each of the T excitations states is greater than or equal to the first preset energy threshold, absolute values of energy differences corresponding to a $(T+1)^{th}$ excitations state to an $M^{th}$ excitations state among the sorted M excitations states are less than the first preset energy threshold, and T is a positive integer greater than or equal to 1 and less than M, and generating the first quantum circuit based on the T excitations states. In other words, in the foregoing technical solution, the M excitations states whose irreducible representations are the same as the irreducible representation of the reference state are first screened out by using a symmetry reduction method, and then an energy sorting optimization method is used for the M excitations states, to determine the T excitations states finally used to determine the first quantum circuit.

Optionally, in some embodiments, the attribute of the reference state is the energy of the reference state, and the attribute of the excitations state is the energy obtained after the reference state is corrected by the excitations state. In this case, determining M excitations states from the N excitations states based on an attribute of the reference state and attributes of the N excitations states includes determining energy of the reference state and energy obtained after the reference state is corrected by each of the N excitations states, separately obtaining a difference between the energy obtained after the reference state is corrected by each of the N excitations states and the energy of the reference state, to obtain N energy differences corresponding to the N excitations states, and determining the M excitations states from the N excitations states based on the N energy differences and a first preset energy threshold, where an absolute value of an energy difference corresponding to each of the M excitations states is greater than or equal to the first preset energy threshold.

Optionally, in some embodiments, determining the M excitations states from the N excitations states based on the N energy differences and a first preset energy threshold includes sorting the N excitations states in descending order of absolute values of the N energy differences, to obtain sorted N excitations states, and determining the M excitations states from the sorted N excitations states based on the absolute values of the N energy differences and the first preset energy threshold, where the M excitations states are a first excitations state to an $M^{th}$ excitations state among the sorted N excitations states, and absolute values of energy differences corresponding to an $(M+1)^{th}$ excitations state to an $N^{th}$ excitations state among the sorted N excitations states are less than the first preset energy threshold.

Optionally, in other embodiments, an absolute value of each of the N energy differences may be sequentially compared with the first preset energy threshold. If an absolute value of an energy difference is greater than or equal to the first preset energy threshold, an excitations state corresponding to the energy difference belongs to the M excitations states. If an absolute value of an energy difference is less than the first preset energy threshold, an excitations state corresponding to the energy difference does not belong to the M excitations states.

Optionally, in some embodiments, the method may further include computing a first molecular ground state energy value based on the first quantum circuit, determining that a difference between the first molecular ground state energy value and a reference molecular ground state energy value is greater than a second preset energy threshold, and generating a second quantum circuit based on the M excitations states and the $(M+1)^{th}$ excitations state to an $(M+K)^{th}$ excitations state among the sorted N excitations states, where K is a positive integer greater than or equal to 1, and a sum of M and K is less than or equal to N. If a difference between a second molecular ground state energy value determined based on the second quantum circuit and the reference molecular ground state energy value is still greater than the second preset energy threshold, excitations states used to determine a quantum circuit may continue to be determined based on the sorted N excitations states. The quantum circuit determined based on the foregoing technical solution can enable chemical precision of a UCCSD-VQE computation result to meet a preset requirement.

In the methods shown in FIG. 4 to FIG. 6, "generating a first quantum circuit based on the 23 (or M) excitations states" may be understood as "generating a parameterized quantum circuit based on the 23 (or M) excitations states and a parameter θ". In other words, the methods shown in FIG. 4 to FIG. 6 have several different implementations of step 201 and step 202 in the method shown in FIG. 2. After the first quantum circuit is determined, computation may continue to be performed according to the procedure shown in FIG. 2, and according to the UCCSD-VQE method. For a specific implementation, refer to FIG. 2. For brevity, details are not described herein again.

Figure 7:
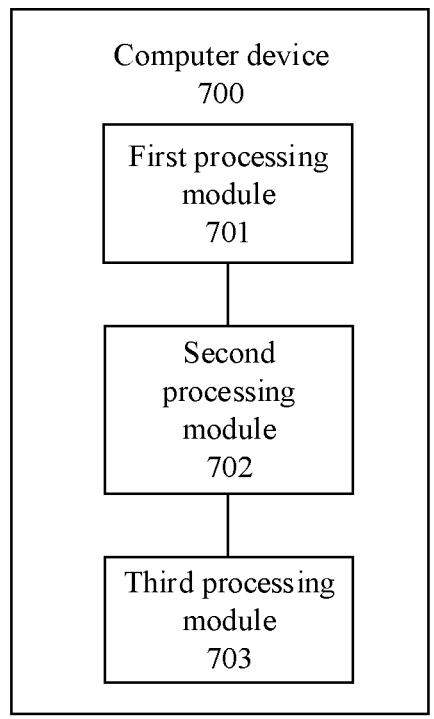
FIG. 7 is a schematic structural block diagram of a computer device according to an embodiment of this disclosure.

FIG. 7 is a schematic structural block diagram of a computer device according to an embodiment of this disclosure. The computer device 700 shown in FIG. 7 may include a first processing module 701, a second processing module 702, and a third processing module 703.

The first processing module 701 is configured to determine a reference state of a target molecule and N excitations states corresponding to the reference state, where N is a positive integer greater than or equal to 1.

The second processing module 702 is configured to determine M excitations states from the N excitations states based on an attribute of the reference state and attributes of the N excitations states, where M is a positive integer greater than or equal to 1 and less than or equal to N.

The third processing module 703 is configured to generate a first quantum circuit based on the M excitations states.

For specific functions and beneficial effects of the first processing module 701, the second processing module 702, and the third processing module 703, refer to descriptions in the foregoing method embodiment. For brevity, details are not described herein again.

The first processing module 701, the second processing module 702, and the third processing module 703 may be implemented by a processor.

Optionally, in some embodiments, the computer device 700 may be a classical computer. In this case, the second processing module 702 may complete UCCSD-VQE computation with a quantum computer, to determine energy of the reference state and energy obtained after the reference state is corrected by each of the N excitations states. For example, the second processing module 702 may be configured to send the reference state and the N excitations states determined by the first processing module 701 to the quantum computer. The quantum computer may be configured to prepare an ansatz and measure the ansatz based on the received excitations states or reference state, and send measurement data to the second processing module 702. The second processing module 702 computes the energy of the corresponding excitations states or reference state based on the received measurement data.

Optionally, in other embodiments, the computer device 700 may be understood as a computer system including a classical computer and a quantum computer. The first processing module 701 and the third processing module 703 may be processors in the classical computer. The second processing module 702 may be further divided into a first processing submodule and a second processing submodule. The first processing submodule may be a processor in the quantum computer, and the second processing submodule may be a processor in the classical computer. The first processing submodule may be configured to prepare the ansatz and measure the ansatz, and send the measurement data to the second processing submodule. The second processing submodule may compute the energy based on the received measurement data.

Figure 8:
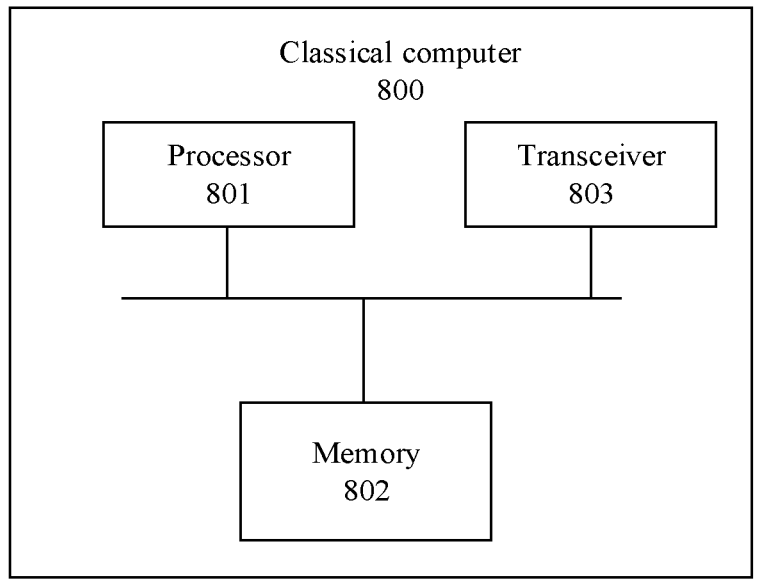
FIG. 8 is a structural block diagram of a classical computer according to an embodiment of this disclosure.

FIG. 8 is a structural block diagram of a classical computer according to an embodiment of this disclosure. The classical computer 800 shown in FIG. 8 includes a processor 801 and a memory 802. The processor 801 and the memory 802 communicate with each other by using an internal bus, to transfer a control signal and/or a data signal. The memory 802 is configured to store a computer program. The processor 801 is configured to invoke the computer program from the memory 802 and run the computer program, so that the classical computer 800 performs steps performed by the classical computer in the foregoing embodiment.

The processor 801 and the memory 802 may be combined into one processing apparatus. The processor 801 is configured to execute program code stored in the memory 802, to implement functions of the classical computer in the foregoing method embodiment. In specific implementation, the memory 802 may alternatively be integrated into the processor 801, or may be independent of the processor 801.

The classical computer 800 may further include a transceiver 803. The transceiver 803 is configured to communicate with a quantum computer. Further, the transceiver 803 may be configured to obtain measurement data obtained by measuring an ansatz by the quantum computer. The transceiver 803 may further send an updated parameter θ to the quantum computer. The transceiver 803 may communicate with the quantum computer in a wired or wireless communication mode. This is not limited in this embodiment of this disclosure.

A person skilled in the art may understand that, in addition to the processor 801, the memory 802, and the transceiver 803 shown in FIG. 8, the classical computer 800 may further include another apparatus not shown in FIG. 8, for example, an input/output device, a power supply, or an antenna.

It should be understood that the classical computer 800 may correspond to the classical computer in the foregoing method embodiment, and the classical computer 800 may also be a chip or a component applied to the classical computer. In addition, units in the classical computer 800 implement corresponding procedures in the foregoing method embodiment. Further, the memory 802 is configured to store the program code, so that when the processor 801 executes the program code, the processor 801 is controlled to perform steps performed by the classical computer in the method. A specific process in which each unit performs the foregoing corresponding steps is described in detail in the foregoing method embodiment. For brevity, details are not described herein again.

Figure 9:
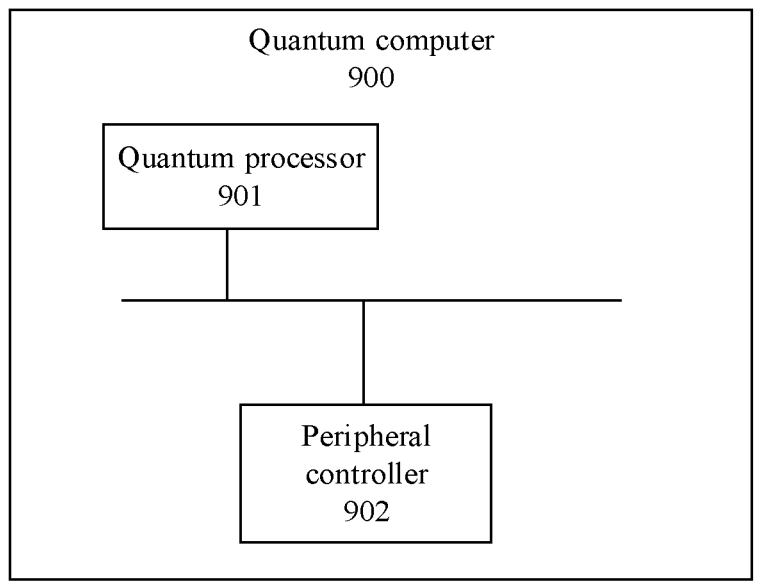
FIG. 9 is a structural block diagram of a quantum computer according to an embodiment of this disclosure.

FIG. 9 is a structural block diagram of a quantum computer according to an embodiment of this disclosure. The quantum computer 900 shown in FIG. 9 includes a quantum processor 901 and a peripheral controller 902. A classical computer controls a peripheral control device to generate a control signal such as a microwave or a laser, to operate the quantum processor, and implement a quantum gate operation and measurement on the quantum processor, so that the quantum computer 900 performs steps performed by the quantum computer in the foregoing embodiment.

An embodiment of this disclosure further provides a computer system. The computer system may include the foregoing quantum computer and classical computer. The computer system may implement a corresponding procedure in the foregoing method embodiment.

An embodiment of this disclosure further provides a chip. The chip includes a logic circuit. The logic circuit is configured to be coupled to an input/output interface, and transmit data by using the input/output interface, to implement a corresponding procedure in the foregoing method embodiment. The chip in this embodiment of this disclosure may be a field-programmable gate array (FPGA), or may be an application-specific integrated circuit (ASIC), or may be a system on chip (SoC), or may be a central processing unit (CPU), or may be a network processor (NP), or may be a digital signal processor (DSP), or may be a micro controller (MCU), or may be a programmable logic device (PLD), another PLD, a discrete gate or transistor logic device, a discrete hardware component, or another integrated chip.

In an implementation process, steps in the foregoing methods can be implemented by using a hardware integrated logic circuit in the processor, or by using instructions in a form of software. The steps of the methods disclosed with reference to the embodiments of this disclosure may be directly performed by a hardware processor, or may be performed by using a combination of hardware in the processor and a software module. A software module may be located in a mature storage medium in the art, such as a random-access memory (RAM), a flash memory, a read-only memory (ROM), a programmable ROM (PROM), an electrically erasable PROM (EEPROM), or a register. The storage medium is located in the memory, and a processor reads information in the memory and completes the steps in the foregoing methods in combination with hardware of the processor. To avoid repetition, details are not described herein again.

It should be noted that the processor in this embodiment of this disclosure may be an integrated circuit chip, and has a signal processing capability. In an implementation process, steps in the foregoing method embodiments can be implemented by using a hardware integrated logic circuit in the processor, or by using instructions in a form of software. The general purpose processor may be a microprocessor, or the processor may be any conventional processor or the like. Steps of the methods disclosed with reference to the embodiments of this disclosure may be directly executed and accomplished by means of a hardware decoding processor, or may be executed and accomplished by using a combination of hardware and software modules in the decoding processor. A software module may be located in a mature storage medium in the art, such as a RAM, a flash memory, a ROM, a PROM, an EEPROM, or a register. The storage medium is located in the memory, and a processor reads information in the memory and completes the steps in the foregoing methods in combination with hardware of the processor.

It may be understood that the memory in the embodiments of this disclosure may be a volatile memory or a nonvolatile memory, or may include a volatile memory and a nonvolatile memory. The nonvolatile memory may be a ROM, a PROM, an erasable PROM (EPROM), an EEPROM, or a flash memory. The volatile memory may be a RAM, used as an external cache. Through example but not limitative description, many forms of RAMs may be used, for example, a static RAM (SRAM), a dynamic RAM (DRAM), a synchronous DRAM (SDRAM), a double data rate (DDR) SDRAM, an enhanced SDRAM (ESDRAM), a synchronous-link DRAM (SLDRAM), and a direct Rambus (DR) DRAM. It should be noted that the memory of the systems and methods described in this specification includes but is not limited to these and any memory of another proper type.

According to the foregoing method embodiment, this disclosure further provides a computer program product. The computer program product includes computer program code. When the computer program code runs on a computer, the computer is enabled to perform the method in any one of the embodiments shown in FIG. 4 to FIG. 6.

According to the foregoing method embodiment, this disclosure further provides a computer readable medium. The computer readable medium stores program code. When the program code runs on a computer, the computer is enabled to perform the method in any one of the embodiments shown in FIG. 4 to FIG. 6.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this disclosure.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this disclosure, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or may not be performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this disclosure may be integrated into one processing unit, or each of the units may exist alone physically, or two or more units are integrated into one unit.

When the functions are implemented in the form of a software functional unit and sold or used as an independent product, the functions may be stored in a computer readable storage medium. Based on such an understanding, the technical solutions of this disclosure essentially, or the part contributing to the current technology, or some of the technical solutions may be implemented in a form of a software product. The software product is stored in a storage medium, and includes several instructions for instructing a computer device (which may be a personal computer, a server, a network device, or the like) to perform all or some of the steps of the methods described in the embodiments of this disclosure. The foregoing storage medium includes any medium that can store program code, such as a Universal Serial Bus (USB) flash drive, a removable hard disk, a ROM, a RAM, a magnetic disk, or an optical disc.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A quantum circuit generation method, comprising:
   determining a reference state of a target molecule and N excitations states corresponding to the reference state, wherein each of the N excitations states represents an electron configuration of the target molecule, and wherein N is a positive integer greater than or equal to 1;
   determining, from the N excitations states and based on a first attribute of the reference state and second attributes of the N excitations states, M excitations states, wherein M is a positive integer greater than or equal to 1 and less than or equal to N; and
   generating, based on the M excitations states, a first quantum circuit.

2. The quantum circuit generation method of claim 1, further comprising:
   determining a first irreducible representation of the reference state and a second irreducible representation of each of the N excitations states; and
   further determining, from the N excitations states and based on the first irreducible representation and the second irreducible representation, the M excitations states, wherein a third irreducible representation of each of the M excitations states is the same as the first irreducible representation.

3. The quantum circuit generation method of claim 2, further comprising:
   determining, based on a group table and first molecular orbital information of the reference state, the first irreducible representation; and
   determining, based on the group table and second molecular orbital information of each of the N excitations states, the second irreducible representation.

4. The quantum circuit generation method of claim 2, further comprising:
   determining a first energy of the reference state;
   correcting the reference state by each of the M excitations states to obtain a second energy;
   separately obtaining a difference between the second energy and the first energy to obtain M energy differences corresponding to the M excitations states;
   sorting the M excitations states in descending order of first absolute values of the M energy differences to obtain sorted M excitations states;
   determining, from the sorted M excitations states and based on the M energy differences and a first preset energy threshold, T excitations states that are a first excitations state to a $T^{th}$ excitations state among the sorted M excitations states, wherein a second absolute value of an energy difference corresponding to each of the T excitations states is greater than or equal to the first preset energy threshold, wherein third absolute values of energy differences corresponding to a $(T+1)^{th}$ excitations state to an $M^{th}$ excitations state among the sorted M excitations states are less than the first preset energy threshold, and wherein T is a positive integer greater than or equal to 1 and less than M; and further generating, based on the T excitations states, the first quantum circuit.

5. The quantum circuit generation method of claim 1, further comprising:

determining a first energy of the reference state;

correcting the reference state by each of the N excitations states to obtain a second energy;

separately obtaining a first difference between the second energy and the first energy to obtain N energy differences corresponding to the N excitations states; and further determining, from the N excitations states and based on the N energy differences and a first preset energy threshold, the M excitations states, wherein a first absolute value of an energy difference corresponding to each of the M excitations states is greater than or equal to the first preset energy threshold.

6. The quantum circuit generation method of claim 5, further comprising:

sorting the N excitations states in descending order of second absolute values of the N energy differences to obtain sorted N excitations states; and further determining, from the sorted N excitations states and based on the second absolute values and the first preset energy threshold, the M excitations states that are a first excitations state to an $M^{th}$ excitations state among the sorted N excitations states, wherein third absolute values of energy differences corresponding to an $(M+1)^{th}$ excitations state to an $N^{th}$ excitations state among the sorted N excitations states are less than the first preset energy threshold.

7. The quantum circuit generation method of claim 6, comprising:

computing, based on the first quantum circuit, a first molecular ground state energy value;

determining that a second difference between the first molecular ground state energy value and a reference molecular ground state energy value is greater than a second preset energy threshold; and generating, based on the M excitations states and the $(M+1)^{th}$ excitations state to an $(M+K)^{th}$ excitations state among the sorted N excitations states, a second quantum circuit, wherein K is a positive integer greater than or equal to 1, and wherein a sum of M and K is less than or equal to N.

8. A computer device, comprising:

a memory configured to store instructions; and a processor coupled to the memory, wherein when executed by the processor, the instructions cause the computer device to:

determine a reference state of a target molecule and N excitations states corresponding to the reference state, wherein each of the N excitations states represents an electron configuration of the target molecule, and wherein N is a positive integer greater than or equal to 1;

determine, from the N excitations states and based on a first attribute of the reference state and second attributes of the N excitations states, M excitations states, wherein M is a positive integer greater than or equal to 1 and less than or equal to N; and generate, based on the M excitations states, a first quantum circuit.

9. The computer device of claim 8, wherein when executed by the processor, the instructions further cause the computer device to:

determine a first irreducible representation of the reference state and a second irreducible representation of each of the N excitations states; and further determine, from the N excitations states and based on the first irreducible representation and the second irreducible representation, the M excitations states, wherein a third irreducible representation of each of the M excitations states is the same as the first irreducible representation.

10. The computer device of claim 9, wherein when executed by the processor, the instructions further cause the computer device to:

determine, based on a group table and first molecular orbital information of the reference state, the first irreducible representation; and determine, based on the group table and second molecular orbital information of each of the N excitations states, the second irreducible representation.

11. The computer device of claim 9, wherein when executed by the processor, the instructions further cause the computer device to:

determine a first energy of the reference state;

correct the reference state by each of the M excitations states to obtain a second energy;

separately obtain a difference between the second energy and the first energy to obtain M energy differences corresponding to the M excitations states;

sort the M excitations states in descending order of first absolute values of the M energy differences to obtain sorted M excitations states;

determine, from the sorted M excitations states, based on the M energy differences, and a first preset energy threshold, T excitations states that are a first excitations state to a $T^{th}$ excitations state among the sorted M excitations states, wherein a second absolute value of an energy difference corresponding to each of the T excitations states is greater than or equal to the first preset energy threshold, wherein third absolute values of energy differences corresponding to a $(T+1)^{th}$ excitations state to an $M^{th}$ excitations state among the sorted M excitations states are less than the first preset energy threshold, and wherein T is a positive integer greater than or equal to 1 and less than M; and further generate, based on the T excitations states, the first quantum circuit.

12. The computer device of claim 8, wherein when executed by the processor, the instructions further cause the computer device to:

determine a first energy of the reference state;

correct the reference state by each of the N excitations states to obtain a second energy;

separately obtain a first difference between the second energy and the first energy to obtain N energy differences corresponding to the N excitations states; and further determine, from the N excitations states and based on the N energy differences and a first preset energy threshold, the M excitations states, wherein a first absolute value of an energy difference corresponding to each of the M excitations states is greater than or equal to the first preset energy threshold.

13. The computer device of claim 12, wherein when executed by the processor, the instructions further cause the computer device to:

sort the N excitations states in descending order of second absolute values of the N energy differences to obtain sorted N excitations states; and further determine, from the sorted N excitations states and based on the second absolute values and the first preset energy threshold, the M excitations states that are a first excitations state to an $M^{th}$ excitations state among the sorted N excitations states, wherein third absolute values of energy differences corresponding to an $(M+1)^{th}$ excitations state to an $N^{th}$ excitations state among the sorted N excitations states are less than the first preset energy threshold.

14. The computer device of claim 13, wherein when executed by the processor, the instructions further cause the computer device to:

compute, based on the first quantum circuit, a first molecular ground state energy value;

determine that a second difference between the first molecular ground state energy value and a reference molecular ground state energy value is greater than a second preset energy threshold; and generate, based on the M excitations states and the $(M+1)^{th}$ excitations state to an $(M+K)^{th}$ excitations state among the sorted N excitations states, a second quantum circuit, wherein K is a positive integer greater than or equal to 1, and wherein a sum of M and K is less than or equal to N.

15. A computer program product comprising computer-executable instructions that are stored on a non-transitory computer-readable medium and that, when executed by a processor, cause an apparatus to:

determine a reference state of a target molecule and N excitations states corresponding to the reference state, wherein each of the N excitations states represents an electron configuration of the target molecule, and wherein N is a positive integer greater than or equal to 1;

determine, from the N excitations states and based on a first attribute of the reference state and second attributes of the N excitations states, M excitations states, wherein M is a positive integer greater than or equal to 1 and less than or equal to N; and generate, based on the M excitations states, a first quantum circuit.

16. The computer program product of claim 15, wherein the computer-executable instructions further cause the apparatus to:

determine a first irreducible representation of the reference state and a second irreducible representation of each of the N excitations states; and further determine, from the N excitations states and based on the first irreducible representation and the second irreducible representation, the M excitations states, wherein a third irreducible representation of each of the M excitations states is the same as the first irreducible representation.

17. The computer program product of claim 16, wherein the computer-executable instructions further cause the apparatus to:

determine, based on a group table and first molecular orbital information of the reference state, the first irreducible representation; and determine, based on the group table and second molecular orbital information of each of the N excitations states, the second irreducible representation.

18. The computer program product of claim 16, wherein the computer-executable instructions further cause the apparatus to:

determine a first energy of the reference state;

correct the reference state by each of the M excitations states to obtain a second energy;

separately obtain a difference between the second energy and the first energy to obtain M energy differences corresponding to the M excitations states;

sort the M excitations states in descending order of first absolute values of the M energy differences to obtain sorted M excitations states;

determine, from the sorted M excitations states, based on the M energy differences, and a first preset energy threshold, T excitations states that are a first excitations state to a $T^{th}$ excitations state among the sorted M excitations states, wherein a second absolute value of an energy difference corresponding to each of the T excitations states is greater than or equal to the first preset energy threshold, wherein third absolute values of energy differences corresponding to a $(T+1)^{th}$ excitations state to an $M^{th}$ excitations state among the sorted M excitations states are less than the first preset energy threshold, and wherein T is a positive integer greater than or equal to 1 and less than M; and further generate, based on the T excitations states, the first quantum circuit.

19. The computer program product of claim 15, wherein the computer-executable instructions further cause the apparatus to:

determine a first energy of the reference state;

correct the reference state by each of the N excitations states to obtain a second energy;

separately obtain a first difference between the second energy and the first energy to obtain N energy differences corresponding to the N excitations states; and further determine, from the N excitations states and based on the N energy differences and a first preset energy threshold, the M excitations states, wherein a first absolute value of an energy difference corresponding to each of the M excitations states is greater than or equal to the first preset energy threshold.

20. The computer program product of claim 19, wherein the computer-executable instructions further cause the apparatus to:

sort the N excitations states in descending order of second absolute values of the N energy differences to obtain sorted N excitations states;

further determine, from the sorted N excitations states and based on the second absolute values and the first preset energy threshold, the M excitations states that are a first excitations state to an $M^{th}$ excitations state among the sorted N excitations states, wherein third absolute values of energy differences corresponding to an $(M+1)^{th}$ excitations state to an $N^{th}$ excitations state among the sorted N excitations states are less than the first preset energy threshold;

compute, based on the first quantum circuit, a first molecular ground state energy value;

determine that a second difference between the first molecular ground state energy value and a reference molecular ground state energy value is greater than a second preset energy threshold; and generate, based on the M excitations states and the $(M+1)^{th}$ excitations state to an $(M+K)^{th}$ excitations state among the sorted N excitations states, a second quantum circuit, wherein K is a positive integer greater than or equal to 1, and wherein a sum of M and K is less than or equal to N.

\* \* \* \* \*